United States Patent [19]

Beausoleil et al.

[11] Patent Number: 4,979,178
[45] Date of Patent: Dec. 18, 1990

[54] TUNABLE NARROW-LINEWIDTH SEMICONDUCTOR LASER

[75] Inventors: Raymond G. Beausoleil, Redmond; Ronald L. Hagman, Renton; John A. McGarvey, Bellevue, all of Wash.

[73] Assignee: The Boeing Company, Seattle, Wash.

[21] Appl. No.: 368,654

[22] Filed: Jun. 20, 1989

[51] Int. Cl.$^5$ ............................................... H01S 3/10
[52] U.S. Cl. .................................................... 372/20
[58] Field of Search ......................................... 372/20

[56] References Cited

U.S. PATENT DOCUMENTS

| | | | |
|---|---|---|---|
| 3,959,739 | 5/1976 | Hutcheson et al. | 372/20 |
| 3,967,211 | 6/1976 | Itzkan et al. | 331/94.55 |
| 4,429,393 | 1/1984 | Giuliano | 372/20 |
| 4,451,923 | 5/1984 | Hansch et al. | 372/32 |
| 4,468,773 | 8/1984 | Seaton | 372/32 |
| 4,484,333 | 11/1984 | Chenausky et al. | 372/20 |
| 4,512,021 | 4/1985 | Chenausky et al. | 372/20 |
| 4,550,410 | 10/1985 | Chenausky et al. | 372/20 |
| 4,583,228 | 4/1986 | Brown et al. | 372/32 |
| 4,586,184 | 4/1986 | Hess | 372/20 |
| 4,677,630 | 6/1987 | Fujita et al. | 372/32 |
| 4,719,635 | 1/1988 | Yeh | 372/50 |
| 4,856,017 | 8/1989 | Ungar | 372/20 |

FOREIGN PATENT DOCUMENTS

WO87/01874  3/1987  PCT Int'l Appl.

OTHER PUBLICATIONS

Kogelnik, H. and Li, T., "Laser Beams and Resonators," *Proc. IEEE*, vol. 54, pp. 1312–1329, Oct. 1966.
Hercher, M., "The Spherical Mirror Fabry-Perot Interferometer," *Applied Optics*, vol. 7, No. 5, pp. 951–966, May 1968.
Bondarenko, A. N. and Kruglov, S. V., "Stabilization of a Ruby Laser Using an He–Ne Laser as a Frequency Reference," *JETP Lett.*, vol. 22, No. 2, pp. 46–47, Jul. 1975.
Tsuchida, H. et al., "Frequency Stability Measurement of Feedback Stabilized AlGaAs DH Laser," *Japanese Journal of Applied Physics*, vol. 19, No. 12, pp. L721–L724, Dec. 1980.
Stokes, L. F. et al., "All-Single-Mode Fiber Resonator," *Optics Letters*, vol. 7, No. 6, pp. 288–290, Feb. 1982.
Dahmani, B. et al., "Frequency Stabilization of Semiconductor Lasers by Resonant Optical Feedback," *Optics Letters*, vol. 12, No. 11, pp. 876–878, Nov. 1987.

*Primary Examiner*—William L. Sikes
*Assistant Examiner*—Robert E. Wise
*Attorney, Agent, or Firm*—Christensen, O'Connor, Johnson & Kindness

[57] ABSTRACT

A system for tuning a narrow-linewidth semiconductor laser such that the laser produces a laser beam at its output port having a desired frequency. The system includes an optical resonator and an optical system for coupling a portion of the laser beam into the resonator along a feedback optical path. The resonator may comprise a pair of faces, an electro-optic material between the faces, and an electrode for generating an electric field in the electro-optic material in response to a control voltage. The laser beam portion that enters the resonator causes the resonator to produce a feedback beam that is coupled into the input port of the laser, to provide optical feedback that causes the laser to lock to a resonance of the optical resonator. Tuning is accomplished by varying the resonance by applying a voltage to the electrode. The optical feedback also reduces the laser's linewidth. In another embodiment, a fiber-optic cable ring resonator is used to produce the feedback beam.

20 Claims, 5 Drawing Sheets

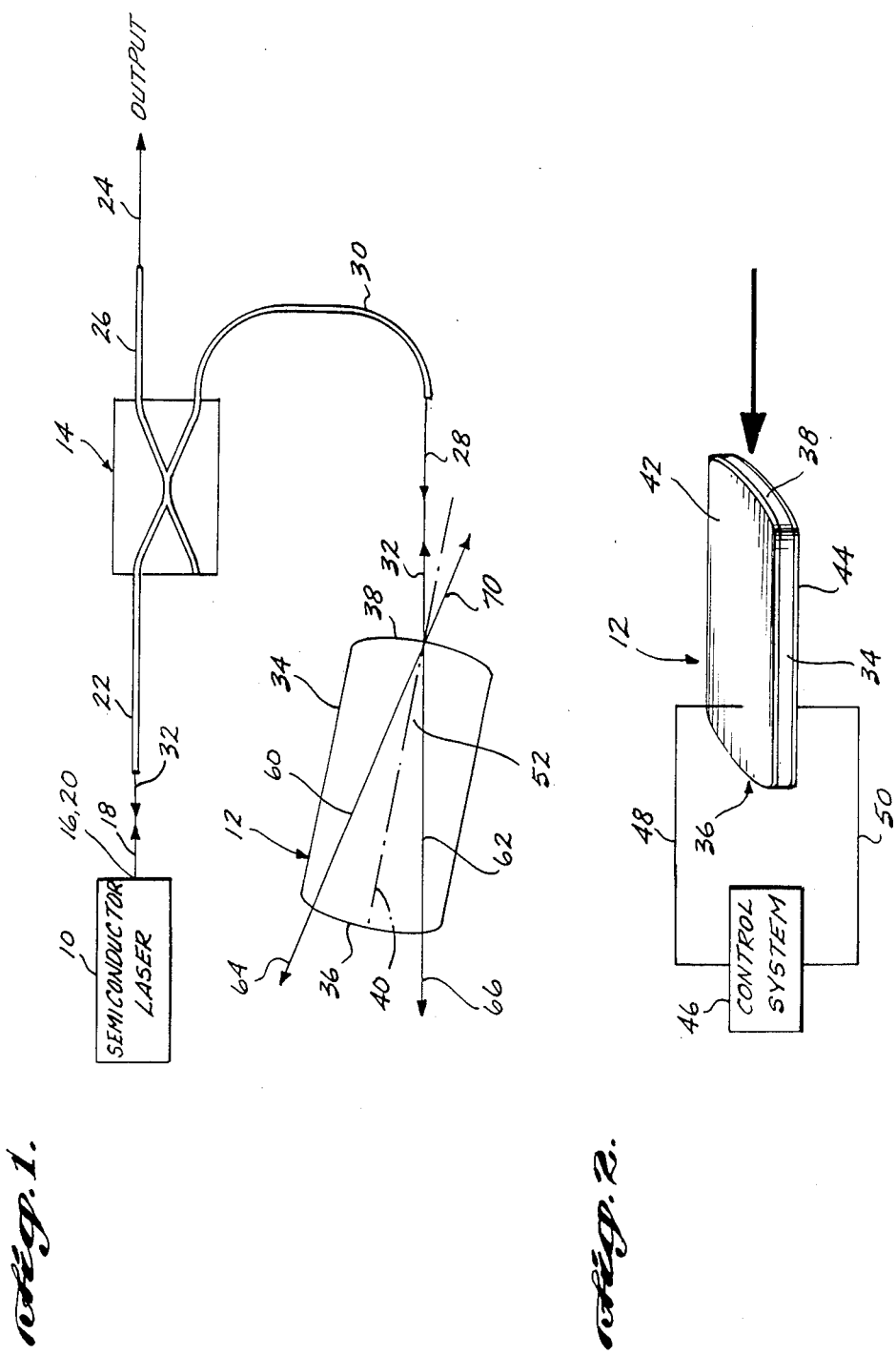

4,979,178

TUNABLE NARROW-LINEWIDTH SEMICONDUCTOR LASER

FIELD OF THE INVENTION

The present invention relates to semiconductor lasers such as laser diodes and, in particular, to a technique for tuning the output frequency of a narrow-linewidth semiconductor laser.

BACKGROUND OF THE INVENTION

Narrow-linewidth semiconductor lasers have been proposed for use as optical sources in FM laser ranging systems. In such a system, an optical beam is transmitted towards a target, and the reflection from the target is received and mixed with a sample of the transmitted beam to produce a detection signal. The frequency of the transmitted beam is swept in a linear manner, such that the frequency of the detecting signal is measure of target range. For intermediate range (10–1,000 meters) and high precision (10–100 microns) systems, a laser source is required having a narrow linewidth, and having the capability of being rapidly tuned over a wide frequency range. To date, there have been no suitable techniques available for adapting semiconductor lasers for use in such systems.

SUMMARY OF THE INVENTION

The present invention provides a system for tuning a semiconductor laser, such that the laser produces a laser beam having a desired frequency. The invention is capable of simultaneously providing center frequency tunability and linewidth reduction, and is suitable for use in an FM laser ranging system.

In a preferred embodiment, the tuning system is used to tune a semiconductor laser that includes an output port at which a laser beam is produced, and an input port at which the laser can receive optical feedback. The tuning system comprises an optical resonator, and coupling means for coupling the laser to the optical resonator. The resonator comprises means defining a resonator optical path, and electro-optic material positioned in the resonator optical path, and an electrode for receiving a resonator control signal having a voltage level. In response to the control, signal, the electrode generates an electric field in the electro-optic material, such that the resonator has a resonant frequency that can be varied by varying the voltage level of the control signal. The coupling means couples a portion of the laser beam into the resonator, such that the resonator produces a feedback beam. The feedback beam is coupled into the laser input port, to provide optical feedback. The control signal is produced by a control means at a voltage level such that the optical feedback causes the laser to produce the laser beam at the desired frequency.

Preferred aspects of the invention include frequency detection means for measuring the output frequency of the laser beam, and providing a corresponding signal to the control means. The control means compares the output frequency to the desired frequency, and varies the control signal so as to reduce the difference between them. The control system may also control the current to the laser diode, to extend the tuning range. The tuning system may also include means for electro-optically varying the optical length between the laser and optical resonator, to further improve the system performance. In a preferred embodiment, the optical resonator comprises a confocal Fabry-Perot cavity fabricated from a wafer-like body of electro-optic material. In another preferred embodiment, the optical resonator comprises a fiber-optic cable ring resonator.

BRIEF DESCRIPTION OF THE DRAWINGS

FIG. 1 is an optical schematic diagram of a first embodiment of the invention;

FIG. 2 is a schematic perspective diagram of an electro-optic Fabry-Perot cavity;

DETAILED DESCRIPTION OF THE INVENTION

Figure 3:
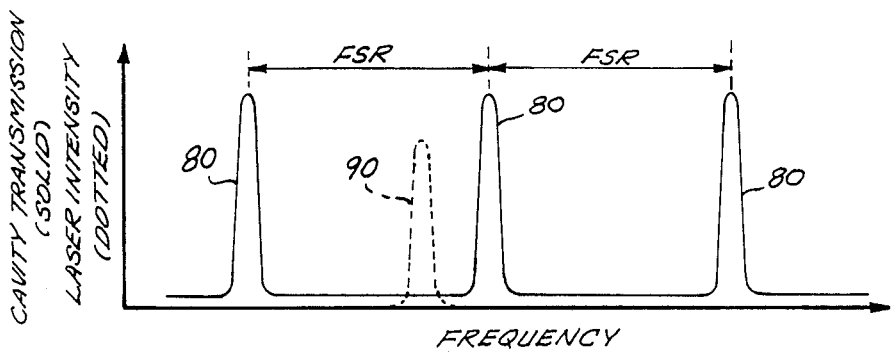
FIG. 3 is a graph illustrating the cavity longitudinal modes and the frequency spectrum of the semiconductor laser.
Figure 4:
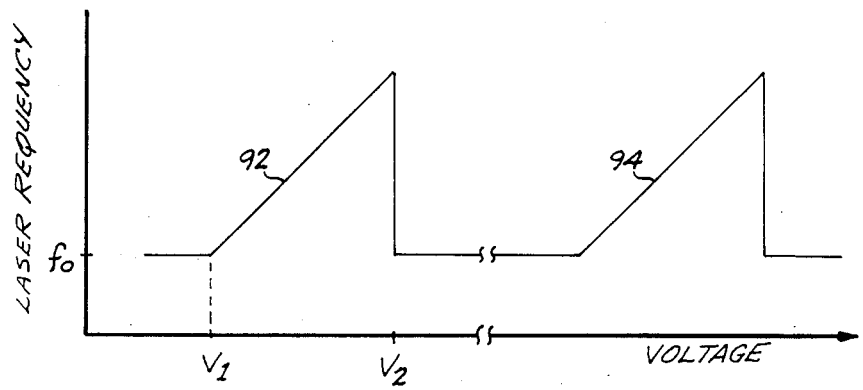
FIG. 4 is a graph illustrating the locking of the laser frequency to cavity longitudinal modes.

The general principles of the present invention can be described with reference to FIGS. 1–4. Referring initially to FIG. 1, the invention provides a system for tuning a semiconductor laser 10. In the illustrated arrangement, the system comprises an optical resonator, here shown as a Fabry-Perot cavity 12, coupled to the laser by directional coupler 14. Laser 10 includes an output port 16 at which the laser prodcues the laser beam 18, and an input port 20 at which the laser can receive optical feedback. For the arrangement shown in FIG.1, the input and output ports are coincident with one another.

Laser beam 18 is conveyed to coupler 14 by fiber-optic cable 22. The laser beam may be coupled into fiber-optic cable 22 using a lens, a glass microsphere, or a lens fabricated on the end of the fiber itself. To simplify the description, the term "beam" will be used herein to include both optical signals traveling through space, and optical signals within fiber-optic cables or waveguides. Coupler 14 divides laser beam 18 into output beam 24 on fiber-optic cable 26, and sample beam 28 on fiber-optic cable 30. Typcially, the sample beam comprises 4–10% of the optical power of the laser beam. The sample beam enters cavity 12, and the cavity produces a feedback beam 32 that retraces the path of sample beam 28 back through fiber-optic cable 30, coupler 14 and fiber-optic cable 22, and into input port 20 of laser 10.

As described in more detail below, the optical feedback provided by this arrangement can cause the laser frequency to lock to the frequency of one of the resonance modes of the optical resonator, e.g., to one of the longitudinal modes of cavity 12. This locking can be used to narrow the linewidth of the laser beam, and to tune the laser beam to a predetermined center frequency. These features in turn make the system well suited for use in an FM laser ranging system. It is important that the feedback from the optical resonator exceed the feedback from all other sources, to provide both significant linewidth reduction and a stable optical lock to a resonance mode of the resonator. Thus for example, to avoid unwanted optical feedback at fiber-optic cable interfaces, fiber facet reflections should be limited by polishing each facet at an angle (e.g., 6°) from the normal.

Referring now to FIG. 1 and 2, cavity 12 includes body 34 that comprises an electro-optic material such as lithium niobate. The body includes a pair of end faces 36 and 38 that between them form a resonant cavity. Preferably, faces 36 and 38 are polished and dielectrically coated to obtain reflectivities in excess of 0.99. In the illustrated embodiment, a confocal cavity is illustrated, wherein each of end faces 36 and 38 has a radius of curvature equal to the distance between the end faces along central axis 40. Body 34 is formed in a thin planar layer, and is sandwiched between a pair of electrodes 42 and 44 that are connected to control system 46 by lines 48 and 50, respectively. Control system 46 applies a voltage between electrodes 42 and 44, to thereby vary the optical path length of cavity 12 via the electro-optic effect, as described more fully below.

In the illustrated preferred embodiment, sample beam 28 is introduced into cavity 12 at the center of face 38, in the plane of body 34. However the sample beam is inclined with respect to central axis 40 at angle 52. The result is a V mode of operation in which the light within cavity 12 bounces back and forth between faces 36 and 38 along paths 60 and 62. In general, for such a mode, a total of four output beams may be produced. In addition to the beam illustrated as feedback beam 32 in FIG. 1, these output beams include beams 64 and 66 emitted from face 36, and beam 70 produced at face 38. Beams 32, 64, and 66 all comprise light that has been transmitted one or more times through body 34, whereas beam 70 comprises both transmitted light and light that reflects directly from face 38 without entering the cavity. Beams 64, 66, and 32 will therefore be referred to as transmitted beams. The cavity is positioned with respect to sample beam 28 and fiber-optic cable 30 such that the transmitted beam formed at face 38 is used to form feedback beam 32. Arrangements in which transmitted beam 64 or transmitted beam 66 form the feedback beam can also be used, as further described below. The arrangement shown in FIG. 1 will often be the simplest, because it permits the feedback beam to be returned to the input port of the laser via the same optical path as that followed by the sample beam. Beam 70 cannot be used as the feedback beam, because it includes directly reflected light that has not been subjected to the frequency selective action of cavity 12.

A given Fabry-Perot cavity will have an unlimited set of orthogonal modes that could be used to produce the feedback signal. In general, any higher order mode can be used, i.e., any mode other than the mode in which the sample signal is coupled into the cavity along central axis 40. By way of example, instead of the V mode described above, one could utilize a mode in which the sample beam is introduced into the cavity parallel to axis 40, but displaced there laterally therefrom. The basic requirement is that the feedback beam should not include any component that has been reflected directly of the cavity. Any suitable mode matching means may be used between fiber-optic cable 30 and cavity 12, to avoid plural spatial modes within the cavity. For example, the sample beam coming from fiber-optic cable 30 may be focused such that it has a beam waist at the center of the cavity.

FIG. 3 presents a graph (solid line), schematically showing the transmission of a Fabry-Perot cavity (or other optical resonator) as a function of frequency. The graph includes a series of equally spaced peaks 80, each peak corresponding to a different longitudinal mode of the cavity. In particular, the center frequency $f_m$ of each peak 80 is given by $$f_m = \frac{cm}{D} \qquad (1)$$

where c is the speed of light, m is the mode number, and D is the round trip optical path length of the cavity. For the illustrated V mode of operation, D is equal to 4 nL, where n is the index of refraction of body 34, and L is the length of the cavity along central axis 40. The spacing between adjacent peaks is referred to as the free spectral range (FSR). FIG. 3 also illustrates a typical spectrum 90 for the laser beam 18 produced by semiconductor laser 10, without the use of the invention.

As may be seen from Equation 1 above, the frequency of each peak 80 is a function of D, and therefore of the index of refraction n of the material forming body 34. Thus by applying a particular voltage to electrodes 42 and 44, control system 46 can vary the index of refraction of body 34, to thereby cause peaks 80 to move horizontally along the frequency axis. When a particular peak 80 is moved into the vicinity of laser specturm 90, the laser frequency becomes locked to the cavity resonance frequency, and the linewidth of spectrum 90 descreases significantly. The locking phenomenon is illustrated by the graph shown in FIG. 4. This graph plots the voltage applied to cavity 12 along the horizontal axis, and the center frequency of laser beam 18 along the vertical axis. The fee running frequency of the laser, without the optical feedback, is assumed to be $f_0$. When the voltage applied to cavity 12 reaches a particular threshold $V_1$, locking occurs, and the laser frequency thereafter varies in an essentially linear manner with voltage. The laser remains locked until voltage $V_2$, at which point the cavity resonance has moved too far away from specturm 90 for the locked condition to be maintained. Continued variation of the voltage will eventually produce a second locked region 94 as the next cavity resonance peak 80 passes through the region of spectrum 90.

Figure 5:
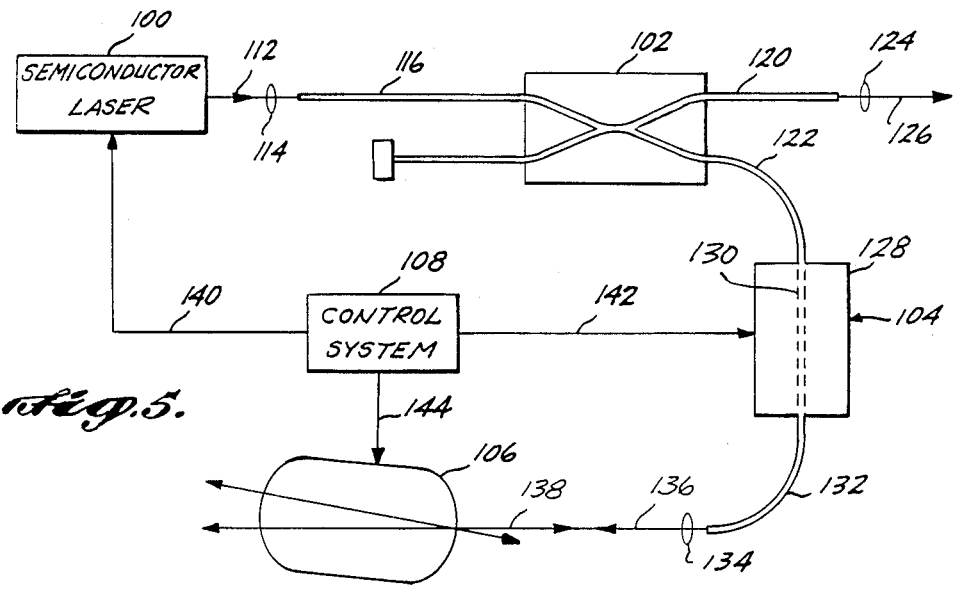
FIG. 5 is a block diagram of a second preferred embodiment of the invention.

The tuning range of the system illustrated in FIG. 1-4 can be significantly extended by taking advantage of the fact that the free running center frequency of a laser diode is a function of the current supplied to the laser diode. In addition, the linewidth or bandwidth of the laser beam can b further narrowed by controlling the optical path length between the laser and the optical resonator. FIG. 5 illustrates a preferred embodiment of the invention that incorporates both of these features. The system shown in FIG. 5 is provided for tuning semiconductor laser 100, and includes directional couple 102, electro-optic phase modulator 104, Fabry-Perot cavity 106 and control system 108.

Cavity 106 may be identical to cavity 14 shown in FIG. 1-2. Laser 100 produces a laser beam 112 that is coupled by lens 114 into fiber-optic cable 116. Directional coupler 102 divides the laser beam into an output beam on fiber-optic cable 120, and a sample beam on fiber-optic cable 122. Coupling lens 124 conditions the output beam emerging from fiber-optic cable 120. Fiber-optic cable 122 couples the sample beam to electro-optic phase modulator 104. Phase modulator 104 comprises an electro-optic material 128 through which the sample beam passes from fiber-optic cable 122 to fiber-optic cable 132 via waveguide 130. The sample beam is then coupled into cavity 106 by coupling lens 134. The cavity responds to the sample beam by producing feedback beam 138. The feedback beam retraces the path of the sample beam back to semiconductor laser 100, to provide optical feedback. Preferably, all components in the system are implemented using polarization preserving components, such as polariztion preserving optical fibers. Coupler 102 may be a variable directional coupler, to permit ready adjustment of the feedback power ratio. For high power semiconductor, lasers, laser beam 112 may be divided into output and sample beams prior to being coupled into a fiber-optic cable.

Control system 108 coordinates the operation of the system, by providing three control signals on lines 140, 142, and 144. The control signal on line 140 provides the current for operation of semiconductor laser 100. The control signal on line 142 provides the voltage level that is applied to electro-optic material 128 and waveguide 130, to thereby modulate the length of the optical path between semiconductor laser 100 and cavity 106. The control signal on line 144 provides the voltage that is applied to cavity 106, in the manner shown in FIG. 2.

The operation of the system of FIG. 5 is generally similar to that described above in connection with FIG. 1–4. However, control system 108 can control the position of laser spectrum 90 by varying the current of the control signal on line 140. Thus a significantly greater operating range is obtained, i.e., the frequency of semiconductor laser 100 can be controlled over a broader range. The control signal on line 140 can provide "coarse" tuning to cause the semiconductor laser to operate close to a desired frequency, and the system can then be fine tuned by means of the control signal on line 144 to produce the desired frequency. For many cases, it will be adequate to simply assume a linear relationship between laser current and the center frequency of laser spectrum 90. For example, for an aluminum gallium arsenide laser diode, the frequency-current characteristic is substantially linear over a significant portion of the laser's operating range, with a slope of about $-3$ GHz/milliamp.

It will be appreciated that the output port of semiconductor laser 100 and the input mirror of cavity 106 themselves form a resonant "cavity" having a length equal to the length of the optical path between the semiconductor laser and cavity 106. The function of phase modulator 104 is to vary the optical path length of this "system" cavity, to optimize performance of the system. Referring to Equation (1), it may be seen that because the round trip optical path length D of the system cavity is relatively long, its resonant frequencies will be relatively closely spaced. Control system 108 varies the control signal on line 142 so as to cause one of the modes of the system cavity to be coincident with the desired operating frequency. As with control signal 140, it will be suitable for most purposes to assume a linear relationship between the voltage on line 142 and the frequency of the system cavity mode. It has been found that adjustment of the system optical path length by means of phase modulator 104 significantly increases the linearity with which the frequency can be varied, as described below.

Figure 6:
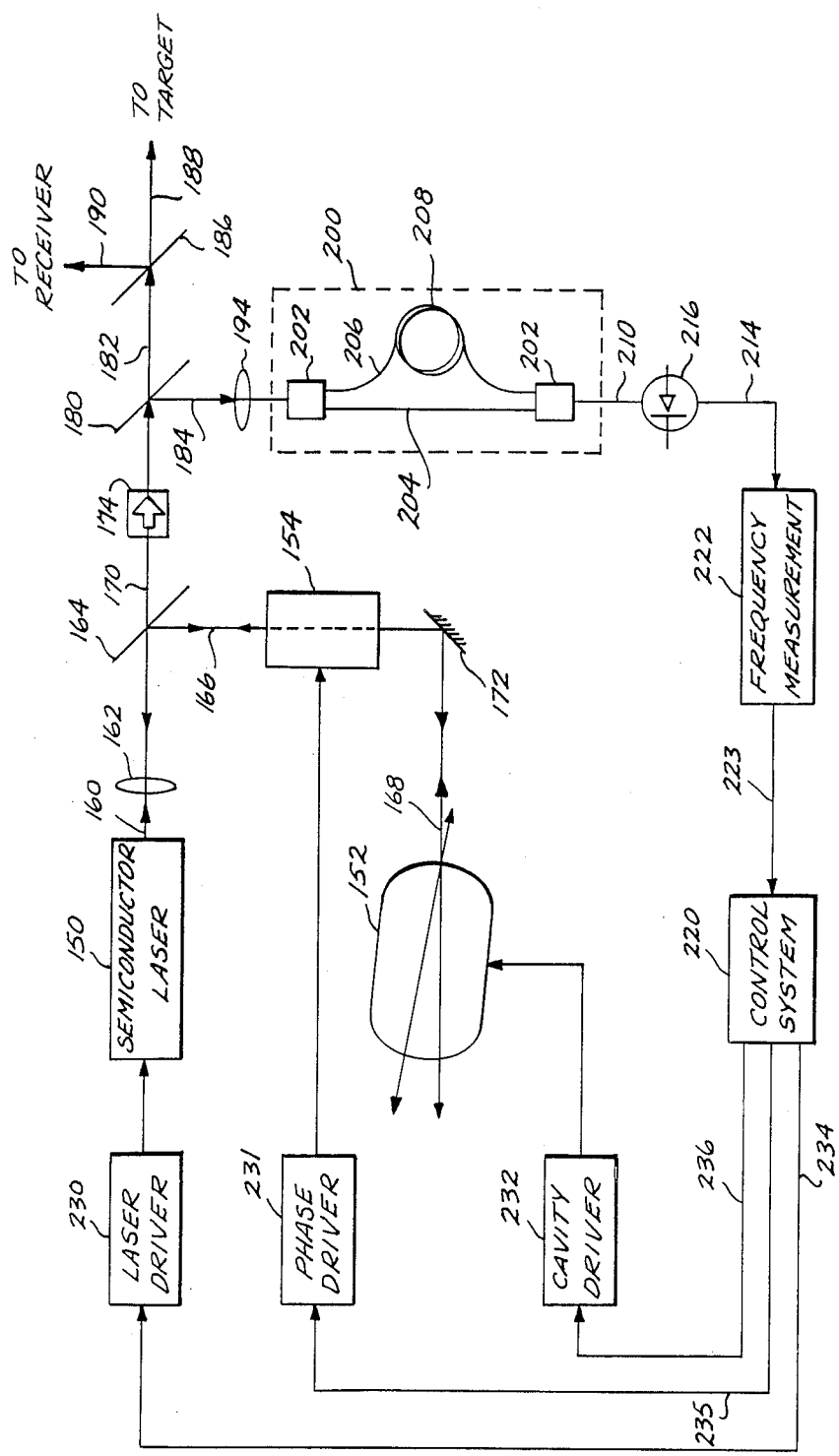
FIG. 6 is a block diagram of a third preferred embodiment of the invention.

The transmitter portion of an FM laser radar system utilizing the present invention is shown in FIG. 6. The illustrated system includes semiconductor laser 150, cavity 152, and electro-optic phase modulator 154, as in the prior embodiment. Laser beam 160 from laser 150 is collimated by lens 162, and then divided by beamsplitter 164 into first sample beam 166 and first continuing beam 170. First sample beam 166 passes through electro-optic modulator 154, and is input to cavity 152 via mirror 172. Feedback beam 168 produced by the cavity then retraces the optical path of the first sample beam back to laser 150. First continuing beam 170 passes through optical isolator 174, and is then further divided by beamsplitter 180 into a second continuing beam 182 and second sample beam 184. Beam 182 is incident onto a third beamsplitter 186, and a portion 188 of beam 182 is transmitted by beamsplitter 186 and directed towards the target. Beamsplitter 186 deflects the optical return beam along path 190 towards a receiver.

Second sample beam 184 is used to determine the frequency of laser beam 160. For this purpose, the second sample beam is focused by lens 194, and input into interferometer 200 that comprises couplers 202 and fiber-optic cables 204 and 206 that form the arms of the interferometer. Fiber-optic cable 206 includes loops 208 that produce an optical path length difference between the interferometer arms, such that when the signals are recombined on fiber-optic, cable 210, interference will cause an intensity modulation of the signal on fiber-optic cable 210, at a frequency proportional to the rate of change of the frequency of the laser beam. This optical signal on fiber-optic cable 210 is converted to an electrical detection signal on line 214 by photodetector 216, and frequency measurement circuit 222 operates as a frequency to voltage converter, producing a signal on line 223 having a voltage level corresponding to the frequency of the signal on line 214. The signal on line 223 is received by control system 220, and converted into a measure of the rate of change of the frequency of laser beam 160.

Operation of the system of FIG. 6 is controlled by control system 220 via laser driver 230, phase driver 231, and cavity driver 232. Drivers 230–232 operate in response to control signals provided by control system 220 on lines 234–236, respectively. In particular, laser driver 230 provides a current signal to semiconductor laser 150, in response to the control signal on 234. Phase driver 231 provides a voltage signal to phase modulator 154 in response to the control signal on line 235. Cavity driver 232 provides a voltage signal to cavity 152, in response to the control signal on line 236. During operation of the system shown in FIG. 6, frequency measurement circuit 222 will produce a signal on line 223 indicating rate of change of the frequency of laser beam 160 produced by laser 150. Control system 220 compares the actual rate of change of frequency with the desired rate, and thereby modifies the control signals on lines 234–236 to correct any observed deviation. For an application in which the laser frequency is not swept, then any suitable wavelength measuring system could be used in place of interferometer 200 to provide a signal that directly indicates the frequency of the laser beam. In such a case, control system 220 would directly compare the measured frequency to the desired frequency, and adjsut the control signals on lines 234–236 accordingly.

Figure 7A:
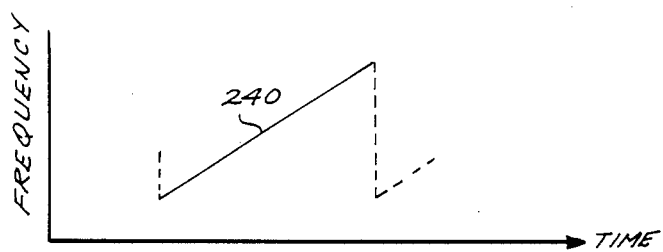
FIG. 7A–7D are graphs illustrating the operation of the system of FIG. 6.
Figure 7B:
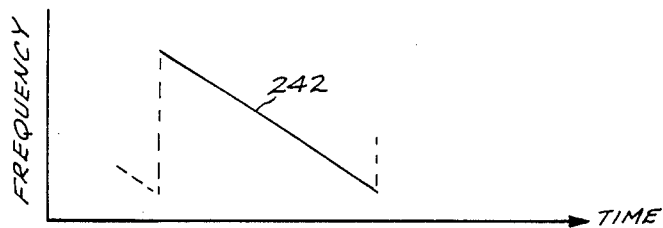
Figure 7C:
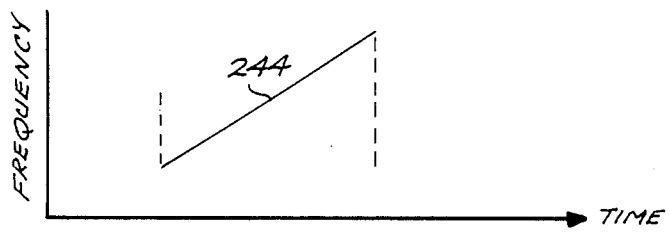
Figure 7D:
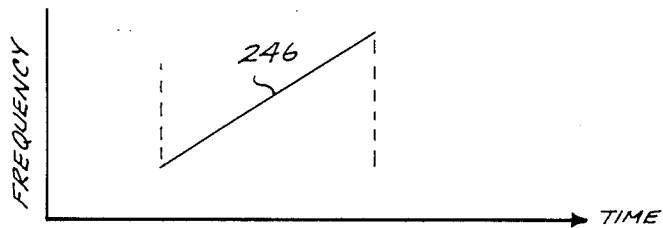

It is assumed that it is desired to sweep the frequency of laser beam 160 in a linear manner, such as shown by frequency ramp 240 in FIG. 7A. To produce such a ramp, control system 220 produces control signals on lines 234–236 that have the general form shown in FIGS. 7B, 7C, and 7D, respectively. This signal provided to laser driver 230 is shown in FIG. 7B. As indicated previously, it may be assumed that the laser frequency is a linear function of the drive current, with frequency decreasing as current increases. A linear negative ramp 242 is therefore provided to laser driver 230, to produce a frequency variation matching frequency ramp 240 shown in FIG. 7A. FIGS. 7C and 7D show similar graphs for controlling phase driver 231 and cavity driver 232, respectively. For cavity 152, it may be assumed that the frequency of the resonance peak is a linear function of the applied voltage, and the proportionality constant between the two can most conveniently be determined by calibration of the system. The proportionally constant corresponds to the slope of ramp 244 in FIG. 7C. For phase modulator 154, it is desired that the phase modulator modulate the optical path length between laser 150 and cavity 152 so that the "cavity" formed by these two elements has a resonance peak at the current laser output frequency. Again, this can be modeled by a linear relationship, and the proportionality constant, corresponding to the slope of ramp 246, can be determined by calibration techniques.

Figure 8:
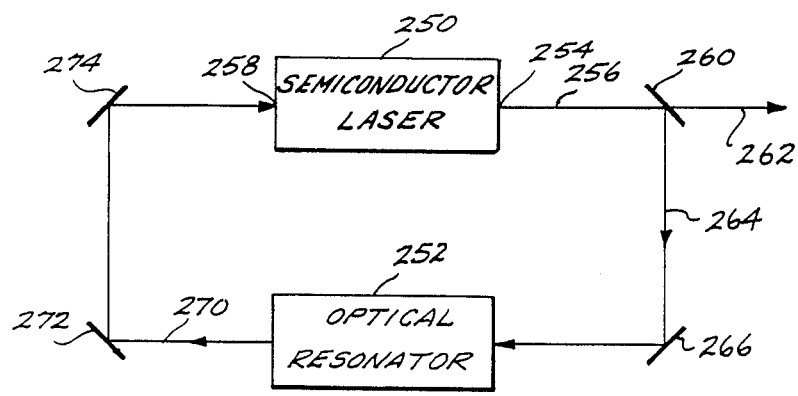
FIG. 8 is a block diagram of a fourth preferred embodiment of the invention.

A further embodiment of the laser tuning system of the present invention is shown in FIG. 8. The system includes semiconductor laser 250 and optical resonator 252. Laser 250 includes output port 254 at which the laser produces laser beam 256, and input port 258 at which the laser receives optical feedback. In this arrangement, the laser output and input ports are located at opposite ends of the laser cavity. Beam splitter 260 divides the laser beam into output beam 262 and sample beam 264, the sample beam being coupled into optical resonator 252 via mirror 266. The optical resonator produces feedback beam 270 that is coupled to input port 258 via mirrors 272 and 274.

The feedback beam in this arrangement emerges from the opposite end of the resonator with respect to the sample beam. Referring back to FIG. 1, beams analogous to beam 64 or 66 could be used to form the feedback beam. Optical isolators (not shown) could be placed in the optical paths of the sample and feedback beams, to ensure that optical signals pass only in the directions indicated by the arrows in FIG. 8. Such isolators would permit the use of a straight-through mode for optical resonator 252, by preventing unwanted reflections from the resonator and laser from interfering with the operation of the system.

Figure 9:
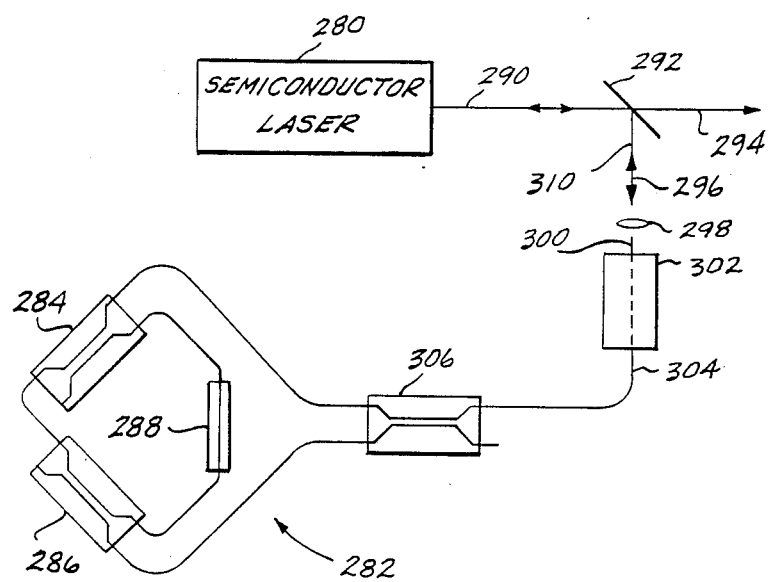
FIG. 9 is a block diagram of a fifth preferred embodiment of the invention.

A further embodiment of the invention is shown in FIG. 9. This embodiment comprises semiconductor laser 280 and fiber-optic cable ring resonator 282. Ring resonator 282 comprises directional couplers 284 and 286 and cable modulator 288. Semiconductor laser 280 produces laser beam 290 that is divided by beam splitter 292 into output beam 294 and sample beam 296. The sample beam is coupled by lens 298 into fiber-optic cable 300, passes through phase modulator 302, and is then coupled into ring resonator 282 by fiber-optic cable 304 and directional coupler 306. The ring resonator produces feedback beam 310 that is returned to the laser along the same optical path as that followed by the sample beam.

Directional couple 306 is preferably a variable directional coupler, having a cross coupling coefficient that can be varied generally between the range of about 5–100 percent. Coupler 284 preferably has a high cross coupling coefficient, e.g., 99 percent, and coupler 286 preferably has a low cross coupling coefficient, on the order of 1 percent. Modulator 288 may be any conventional means for modulating the optical path length of a fiber-optic cable, for cable, for example, a bimorphic PZT crystal. A control system (not shown) provides a control signal to modulator 288, so as to vary the resonant frequencies of the ring resonator, and thereby tune the laser.

While the preferred embodiment of the invention have been illustrated and described, variations will be apparent to those skilled in the art. Accordingly, the scope of the invention is to be determined by reference to the following claims.

The embodiment of the invention in which an exclusive property or privilege is claimed are defined as follows:

1. A system for tuning a semiconductor laser having an output port, an input port, and means for producing a laser beam at the output port, such that the laser beam has a desired frequency, the system comprising:
   an optical resonator, the resonator comprising means defining a resonator optical path, an electro-optic material positioned in the resonator optical path, and an electrode for receiving a resonator control signal having a voltage level and for generating an electric field in the electro-optic material in response thereto, whereby the resonator has a resonant frequency that can be varied by varying the voltage level of the resonator control signal;
   coupling means for coupling a portion of the laser beam into the resonator such that the resonator produces a feedback beam, and means for coupling the feedback beam into the input port to provide optical feedback to the laser; and
   control means for providing the resonator control signal at a voltage level such that the optical feedback causes the laser to produce the laser beam at the desired frequency.

2. The system of claim 1, wherein the laser produces the laser beam in response to a laser current signal provided to the laser, and wherein the control means provides the laser current signal at a current level such that the laser produces the laser beam at a frequency approximately equal to the desired frequency.

3. The system of claim 2, wherein the feedback beam follows a feedback optical path from the resonator to the input port, and wherein the system further comprises means for electro-optically varying the optical path length of the feedback optical path in response to a system cavity control signal, and wherein the control means provides the system cavity control signal such that a system cavity formed by the laser and resonator has a resonant mode approximately equal to the desired frequency.

4. The system of claim 1, wherein the feedback beam follows a feedback optical path from the resonator to the input port, and wherein the system further comprises means for electro-optically varying the optical path length of the feedback optical path in response to a system cavity control signal, and wherein the control means provides the system cavity control signal such that a system cavity formed by the laser and resonator has a resonant mode approximately equal to the desired frequency.

5. The system of claim 1, further comprising frequency detection means for providing a detection signal indicative of the output frequency, and wherein the control means includes means for receiving the detection signal and for varying the resonator control signal such that the difference between the output frequency and the desired frequency is reduced.

6. The system of claim 1, wherein the means defining a resonator optical path forms a Fabry-Perot cavity.

7. The system of claim 6, wherein the cavity comprises a wafer-like body having a pair of opposed faces, the body comprising the electro-optic material.

8. The system of claim 7, wherein the cavity is a confocal cavity in which each face has a radius of curvature substantially equal to a distance between the faces.

9. The system of claim 8, wherein each face has a center, a line between the centers defining a cavity longitudinal axis, and wherein the laser beam portion is coupled into the cavity at the center of one face, inclined with respect to the longitudinal axis, to thereby produce a V-mode of operation.

10. The system of claim 6, wherein the cavity is a confocal cavity having a pair of opposed faces, each face having a radius of curvature substantially equal to a distance between the faces.

11. The system of claim 10, wherein each face has a center, a line between the centers defining a cavity longitudinal axis, and wherein the laser beam portion is coupled into the cavity at the center of one face, inclined with respect to the longitudinal axis, to thereby produce a V-mode of operation.

12. A transmitter for an FM laser radar system, comprising:
    a semiconductor laser having an output port, an input port, and means for porducing a laser beam at the output port at an output frequency;
    an optical resonator, the resonator comprising means defining a resonator optical path, an electro-optic material positioned in the resonator optical path, and an electrode for receiving a resonator control signal having a voltage level and for generating an electric field in the electro-optic material in response thereto, whereby the resonator has a resonant frequency that can be varied by varying the voltage level of the resonator control signal;
    coupling means for coupling a portion of the laser beam into the resonator such that the resonator produces a feedback beam, and means for coupling the feedback beam into the input port to provide optical feedback to the laser; and
    control means for providing the resonator control signal and for varying the voltage level of the resonator control signal such that the optical feedback causes the output frequency to vary in a predetermined manner.

13. The system of claim 12, further comprising frequency detection means for providing a detection signal indicative of the output frequency, and wherein the control means includes means for receiving the detection signal and for responding to the detection signal by causing the output frequency to vary in said predetermined manner.

14. The system of claim 13, wherein the detection signal is proportional to the rate of change of the output frequency.

15. The system of claim 12, wherein the laser produces the laser beam in response to a laser current signal provided to the laser, and wherein the control means provides the laser current signal at a cureent level such that the out put frequency varies in said predetermined manner.

16. The system of claim 15, wherein the feedback beam follows a feedback optical path from the resonator to the input port, and wherein the system further comprises means for electro-optically varying the optical path length of the feedback optical path in response to a system cavity control signal, and wherein the control means provides the system cavity control signal such that a system cavity formed by the laser and resonator has a resonant mode approximately equal to a desired frequency.

17. The system of claim 12, wherein the means defining a resonator optical path forms a Fabry-Perot cavity that includes a wafer-like body having a pair of opposed faces, the body comprising the electro-optic material.

18. A system for turning a semiconductor laser having an output port, an input port, and means for producing a laser beam at the output port, such that the laser beam has a desired frequency, the system comprising:
    an optical resonator, the resonator comprising a fiber-optic cable ring resonator including fiber-optic cable means for defining a circular optical path and means for varying the optical path length of said path in response to a control signal, whereby the ring resonator has a resonant frequency that can be varied by varying the control signal;
    coupling means for coupling a portion of the laser into the resonator such that the resonator produces a feedback beam, and means for coupling the feedback beam into the input port to provide optical feedback to the laser; and
    control means for providing the control signal such that the optical feedback causes the laser to produce the laser beam at the desired frequency.

19. The system of claim 18, wherein the laser produces the laser beam in response to a laser current signal provided to the laser, and wherein the control means provides the laser current signal at a current level such that the laser produces the laser beam at a frequency approximately equal to the desired frequency.

20. The system of claim 19, wherein the feedback beam follows a feedback optical path from the resonator to the input port, and wherein the system further comprises means for electro-optically varing the optical path length of the feedback optical path in response to a system cavity control signal, and wherein the control means includes means for varying the system cavity control signal such that a system cavity formed by the laser and resonator has a resonant mode approximately equal to the desired frequency.

* * * * *

UNITED STATES PATENT AND TRADEMARK OFFICE
CERTIFICATE OF CORRECTION

PATENT NO. : 4,979,178

DATED : December 18, 1990

INVENTOR(S) : Beausoleil et al.

It is certified that error appears in the above-identified patent and that said Letters Patent is hereby corrected as shown below:

| Column | Line | |
|---|---|---|
| 1 | 45 | Delete "control," and insert therefor --control-- |
| 2 | 36 | Delete "prodcues" and insert therefor --produces-- |
| 2 | 51 | Delete "Typcially," and insert therefor --Typically,-- |
| 3 | 7 | Delete "FIG. 1" and insert therefor --FIGURES 1-- |
| 3 | 10 & 11 | Delete "Per-ferably" and insert therefor --Preferably,-- |
| 3 | 59 | Delete "introducted" and insert therefor --introduced-- |
| 3 | 60 & 61 | Delete "ther-from" and insert therefor --therefrom-- |
| 3 | 63 | Delete "of" and insert therefor --off-- |
| 4 | 28 | Delete "specturm" and insert therefor --spectrum-- |
| 4 | 31 | Delete "descreases" and insert therefor --decreases-- |
| 4 | 35 | Delete "fee" and insert therefor --free-- |
| 4 | 42 | Delete "specturm" and insert therefor --spectrum-- |
| 4 | 47 | Delete "FIG. 1-4" and insert therefor --FIGS. 1-4-- |
| 4 | 52 | Delete "b" and insert therefor --be-- |
| 4 | 61 | Delete "FIG. 1-2" and insert therefor --FIGS. 1-2-- |
| 5 | 10 | Delete "polariztion" and insert therefor --polarization-- |
| 5 | 27 & 28 | Delete "FIG. 1-4" and insert therefor --FIGS. 1-4-- |
| 7 | 15 | Delete "proportionally" and insert therefor --proportionality-- |
| 7 | 64 | Delete "couple 306" and insert therefor --coupler 306-- |
| 8 | 4 | Delete "for cable," |
| 8 | 9 | Delete "embodiment" and insert therefor --embodiments-- |
| 9 | 32 | Delete "porducing" and insert therefor --producing-- |
| 10 | 7 | Delete "cureent" and inset therefor --current-- |
| 10 | 8 | Delete "out put" and insert therefor --output-- |

UNITED STATES PATENT AND TRADEMARK OFFICE
CERTIFICATE OF CORRECTION

PATENT NO. : 4,979,178

DATED : December 18, 1990

INVENTOR(S) : Beausoleil et al

It is certified that error appears in the above-identified patent and that said Letters Patent is hereby corrected as shown below:

| Column | Line | |
|--------|------|---|
| 10 | 35 | After "laser" insert --beam-- |

Signed and Sealed this

Fourteenth Day of January, 1992

Attest:

HARRY F. MANBECK, JR.

Attesting Officer  Commissioner of Patents and Trademarks